(12) United States Patent
Chen et al.

(10) Patent No.: US 12,471,485 B2
(45) Date of Patent: Nov. 11, 2025

(54) DISPLAY PANEL AND PREPARATION METHOD THEREFOR, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Liqiang Chen, Beijing (CN); Yaming Wang, Beijing (CN); Mengyuan Pang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/917,945

(22) PCT Filed: Oct. 22, 2021

(86) PCT No.: PCT/CN2021/125582
§ 371 (c)(1),
(2) Date: Oct. 10, 2022

(87) PCT Pub. No.: WO2023/065288
PCT Pub. Date: Apr. 27, 2023

(65) Prior Publication Data
US 2024/0260433 A1 Aug. 1, 2024

(51) Int. Cl.
*H10K 59/80* (2023.01)
*H10K 102/00* (2023.01)

(52) U.S. Cl.
CPC ..... *H10K 59/8793* (2023.02); *H10K 59/8792* (2023.02); *H10K 2102/311* (2023.02)

(58) Field of Classification Search
CPC ........... H10K 59/8793; H10K 59/8792; H10K 2102/311; G09F 9/335; G09F 9/301; G09F 9/30; G06F 1/1652
See application file for complete search history.

(56) References Cited

U.S. PATENT DOCUMENTS

2019/0165332 A1* 5/2019 Kwon ................... H10K 50/15
2019/0280245 A1 9/2019 Kwon et al.
(Continued)

FOREIGN PATENT DOCUMENTS

CN 108766988 A 11/2018
CN 108878687 A 11/2018
(Continued)

*Primary Examiner* — Suberr L Chi
(74) *Attorney, Agent, or Firm* — Ling Wu; Stephen Yang; Ling and Yang Intellectual Property

(57) ABSTRACT

A display panel and a preparation method therefor, and a display apparatus are provided. The display panel has at least one bendable region, and the display panel includes a display device layer and an optical structure film layer disposed on the display device layer, an edge of at least a part of the optical structure film layer in a direction along a bending axis of the at least one bendable region is provided with a protrusion, and vertical projections of the protrusion and the display device layer on the optical structure film layer are not overlapped, and at least a part of the protrusion is located in the at least one bendable region.

13 Claims, 7 Drawing Sheets

(56) References Cited

U.S. PATENT DOCUMENTS

| | | |
|---|---|---|
| 2019/0371879 A1 | 12/2019 | Li |
| 2020/0119292 A1 | 4/2020 | Li et al. |
| 2021/0274659 A1 | 9/2021 | Cai et al. |
| 2021/0408473 A1 | 12/2021 | Jiang et al. |
| 2022/0397938 A1 | 12/2022 | Ouyang et al. |
| 2023/0049009 A1 | 2/2023 | Wu et al. |

FOREIGN PATENT DOCUMENTS

| | | |
|---|---|---|
| CN | 109872629 A | 6/2019 |
| CN | 110190102 A | 8/2019 |
| CN | 110416273 A | 11/2019 |
| CN | 111048549 A | 4/2020 |
| CN | 111445799 A | 7/2020 |
| CN | 111446278 A | 7/2020 |
| CN | 111798759 A | 10/2020 |
| CN | 112396964 A | 2/2021 |
| CN | 112750365 A | 5/2021 |
| WO | 2020248246 A1 | 12/2020 |
| WO | 2021169620 A1 | 9/2021 |

\* cited by examiner

DISPLAY PANEL AND PREPARATION METHOD THEREFOR, AND DISPLAY APPARATUS

CROSS-REFERENCE TO RELATED APPLICATION

The present application is a U.S. National Phase Entry of International Application PCT/CN2021/125582 having an international filing date of Oct. 22, 2021, and the contents disclosed in the above-mentioned application are hereby incorporated as a part of this application.

TECHNICAL FIELD

Embodiments of the present disclosure relate to, but are not limited to, the field of display technologies, and in particular to a display panel, a method for preparing the display panel, and a display apparatus.

BACKGROUND

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, extremely high response speed, lightness and thinness, flexibility, and low costs. With constant development of display technologies, a flexible display that uses an OLED or a QLED as a light emitting device and performs signal control by a Thin Film Transistor (TFT for short) has become a mainstream product in the field of display at present.

With continuous development of display technology, the trend of miniaturization and thinness of electronic products gradually appears, and OLED flexible display screen develops rapidly under this drive. When the OLED flexible display screen is bent outward, a relatively large stress will be applied to an edge of the bendable region, which will easily generate cracks extending towards the inside of the bendable region, thus affecting a display effect.

SUMMARY

In a first aspect, an embodiment of the present disclosure provides a display panel having at least one bendable region. The display panel includes a display device layer and an optical structure film layer disposed on the display device layer. In a direction along a bending axis of the bendable region, an edge of at least a part of the optical structure film layer is provided with a protrusion, and a vertical projection of the protrusion on the optical structure film layer does not overlap with a vertical projection of the display device layer on the optical structure film layer, and at least a part of the protrusion is located in the at least one bendable region.

In an exemplary implementation, a distance between an edge of the protrusion and an edge of the display device layer is 0.05 mm to 0.5 mm in the direction along the bending axis of the at least one bendable region.

In an exemplary implementation, in a bendable region, an entire edge of the optical structure film layer is provided with the protrusion; or, in the bendable region, a part of the edge of the optical structure film layer is provided with the protrusion.

In an exemplary implementation, the display panel further has a non-bendable region connected to the bendable region. In the non-bendable region, the protrusion is disposed at an entire edge of the optical structure film layer in the direction along the bending axis of the at least one bendable region; or, in the non-bendable region, a part of the edge of the optical structure film layer is provided with the protrusion in the direction along the bending axis of the at least one bendable region.

In an exemplary implementation, the protrusion located in the bendable region and the protrusion located in the non-bendable region are formed into an integrated structure; or, the protrusion located in the bendable region and the protrusion located in the non-bendable region are disconnected from each other.

In an exemplary implementation, the protrusion is located in the entire bendable region and in a part of the non-bendable region, the protrusion in the bendable region and the protrusion in the non-bendable region are formed into an integrated structure. In a direction perpendicular to the bending axis of the bendable region, the protrusion has a first edge and a second edge oppositely arranged, the bendable region has a third edge and a fourth edge oppositely arranged, the first edge and the third edge are located at a first side of the bending axis of the bendable region, and the second edge and the fourth edge are located at a second side of the bending axis of the bendable region; the first side and the second side are located at opposite sides of the bending axis of the bendable region; the first edge extends beyond the third edge, and a distance from the first edge to the third edge is greater than or equal to a bending tolerance; and/or, the second edge extends beyond the fourth edge, and a distance from the second edge to the fourth edge is greater than or equal to the bending tolerance.

In an exemplary implementation, in a plane parallel to the plane where the display panel is located, a shape of an edge of the protrusion includes at least one of the following: a straight line, a U-shaped wave, a circular arc-shaped wave, a V-shaped wave, and a trapezoidal wave.

In an exemplary implementation, the protrusion includes multiple sub-protrusions that are disconnected from each other.

In an exemplary implementation, a cross-sectional shape of the sub-protrusion in a plane parallel to the display panel includes at least one of following: a rectangle, a U-shape, a circular arc, a V-shape, and a trapezoid.

In an exemplary implementation, a surface of the protrusion close to the display device layer is provided with a shielding layer.

In an exemplary implementation, the display device layer includes a back film, a first optical adhesive layer disposed on the back film, and a light-emitting structure layer disposed at a side of the first optical adhesive layer away from the back film, wherein the light-emitting structure layer at least includes an encapsulation layer, and the encapsulation layer at least includes an inorganic insulation layer.

In an exemplary implementation, the display panel further includes an edge device layer. The edge device layer is disposed in a same layer as the display device layer. A vertical projection of the edge device layer on the optical structure film layer is overlapped with the protrusion. An edge of the edge device layer close to the display device layer and an edge of the display device layer are disconnected from each other, and an edge of the edge device layer away from the display device layer is flush with an edge of the optical structure film layer.

In an exemplary implementation, an insulation adhesive layer is disposed between the edge of the edge device layer close to the display device layer and the edge of the display device layer.

In an exemplary implementation, the optical structure film layer includes a second optical adhesive layer, a polarizer disposed on the second optical adhesive layer, a third optical adhesive layer disposed at a side of the polarizer away from the second optical adhesive layer, and a cover plate disposed at a side of the third optical adhesive layer away from the polarizer; an edge of at least one of the second optical adhesive layer, the polarizer, the third optical adhesive layer and the cover plate is provided with the protrusion along the direction of the at least one bending axis of the bendable region.

In a second aspect, an embodiment of the present disclosure further provides a display panel having a planarization region and a curved edge located at a circumferential side of the planarization region. The curved edge is provided with a display device layer and an optical structure film layer disposed on the display device layer, and an edge of at least a part of the optical structure film layer is provided with a protrusion, vertical projections of the protrusion and the display device layer on the optical structure film layer are not overlapped.

In a third aspect, an embodiment of the present disclosure further provides a display apparatus, including the aforementioned display panel.

In a fourth aspect, an embodiment of the present disclosure provides a method for preparing a display panel, including:
  forming a display device layer and forming at least a part of film layers in an optical structure film layer;
  attaching at least a part of film layers in the optical structure film layer to the display device layer, so as to extend an edge of the at least part of the film layers in the optical structure film layer beyond an edge of the display device layer; and
  forming another part of the film layers in the optical structure film layer on the at least part of the film layers in the optical structure film layer to form the optical structure film layer, wherein the display device layer and the optical structure film layer constitute the display panel, and the display panel has at least one bendable region, and in a direction along a bending axis AA' of the at least one bendable region, an edge of the at least part of the film layers in the optical structure film layer extends beyond the edge of the display device layer to form a protrusion, and at least part of the protrusion is located in the at least one bendable region.

In an exemplary implementation, the method further includes:
  forming a shielding layer on a surface of the protrusion close to the display device layer.

In a fifth aspect, an embodiment of the present disclosure further provides a method for preparing a display panel, including:
  forming a display device panel and forming at least a part of film layers in an optical structure film layer;
  attaching the display device panel to the at least part of the film layers in the optical structure film layer;
  cutting an edge region of the display device panel without cutting the at least part of the film layers in the optical structure film layer, so as to form a main part of the display device panel into a display device layer and form the edge region of the display device panel into an edge device layer; and a cutting gap is formed between an edge of the edge device layer and an edge of the display device layer; and
  filling an insulation adhesive layer in the cutting gap; or, removing the edge device layer, wherein the display device layer and the optical structure film layer constitute a display panel, and the display panel has at least one bendable region; in a direction along a bending axis AA' of the at least one bendable region, an edge of the at least part of film the layers in the optical structure film layer extends beyond an edge of the display device layer to form a protrusion, and at least a part of the protrusion are located in the at least one bendable region.

Other aspects may be understood upon reading and understanding the drawings and the detailed description.

DETAILED DESCRIPTION

The embodiments of the present disclosure will be described in detail below with reference to the drawings. It is to be noted that implementation modes may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the specification, for convenience, wordings indicating directional or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand meanings of the above-mentioned terms in the present disclosure according to situations.

In the present disclosure, "about" refers to that a boundary is defined not so strictly and numerical values within process and measurement error ranges are allowed.

Figure 1:
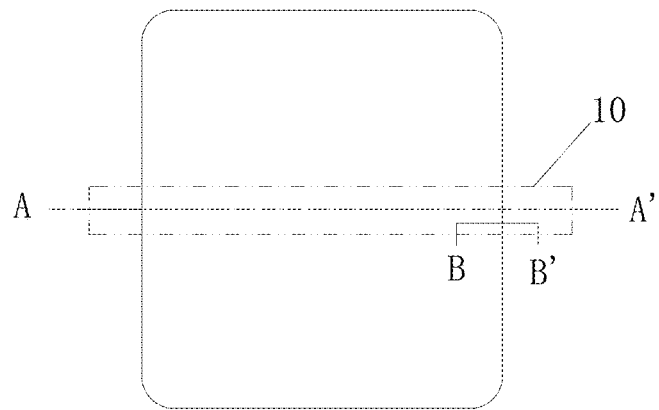
FIG. 1 is a schematic diagram of a structure of a display panel in a related art.
Figure 2:
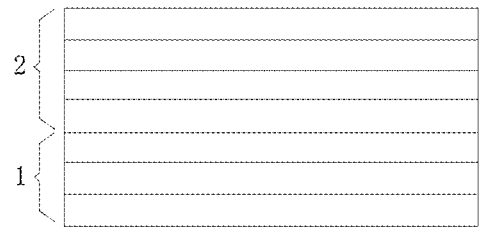
FIG. 2 is a cross-sectional view of a display panel in a related art.

FIG. 1 is a schematic diagram of a structure of a display panel in a related art. FIG. 2 is a cross-sectional view of a display panel in a related art. Illustration is made with an example that FIG. 2 is a cross-sectional view taken along B-B' direction in FIG. 1. As shown in FIG. 1 and FIG. 2, the display panel in the related art includes a display device layer 1 and an optical structure film layer 2 disposed on the display device layer 1. The display panel in the related art has at least one bendable region 10, wherein the display panel can be bent at the least one bendable region 10. AA' is a bending axis of the at least one bendable region 10. In a bendable region 10, an edge of the optical structure film layer 2 is flush with an edge of the display device layer 1 in a direction where the bending axis AA' of the bendable region 10 is located.

According to the research of the inventor of the present application, the display device layer 1 will be easily eroded by water and oxygen, which leads to damages to pixels and a shortened the device life. The display device layer 1 generally functions to isolate water and oxygen and protect the display device by an encapsulation layer. In the prior art, after an optical structure film such as a polarizer is formed on the encapsulation layer of the display device layer 1, the display panel is cut integrally, so that an edge of the optical structure film such as a polarizer is flush with that of a base material such as the encapsulation layer in the display device layer 1. When the bendable region 10 is bent, a relatively large stress will be applied to the edge of the display panel, leading to damages to the encapsulation layer and then an impact on the display effect of the display device layer 1.

Figure 3:
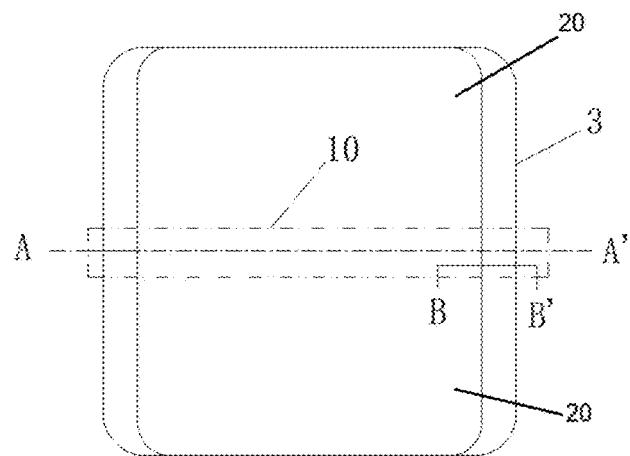
FIG. 3 is a first schematic diagram of a structure of a display panel according to an embodiment of the present application.
Figure 4:
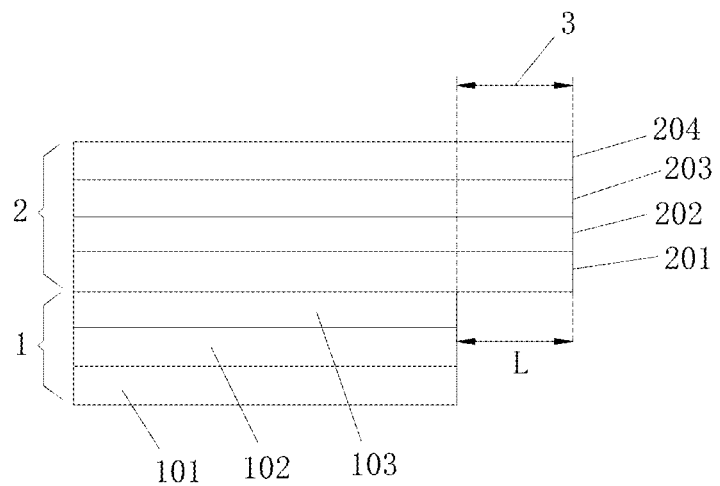
FIG. 4 is a first cross-sectional view of a display panel according to an embodiment of the present application.

FIG. 3 is a first schematic diagram of a structure of a display panel according to an embodiment of the present application. FIG. 4 is a first cross-sectional view of a display panel according to an embodiment of the present application. Illustration is made with an example that FIG. 4 is a cross-sectional view taken along B-B' direction in FIG. 3. As shown in FIG. 3 and FIG. 4, in a direction perpendicular to a plane where the display panel is located, the display panel according to the embodiment of the present application includes a display device layer 1 and an optical structure film layer 2 disposed on the display device layer 1. The display device layer 1 is configured to emit light and display an image. The optical structure film layer 2 is disposed at a light emitting side of the display device layer 1, and is at least configured to protect the display device layer 1.

In an exemplary implementation, the display device layer 1 may include a back film 101, a first optical adhesive layer 102 disposed on the back film 101, and a light-emitting structure layer 103 disposed at a side of the first optical adhesive layer 102 away from the back film 101. The back film 101 is configured to support and protect the light-emitting structure layer 103. The light-emitting structure layer 103 is configured to emit light and display an image. The light-emitting structure layer 103 at least includes a light emitting unit and an encapsulation layer disposed on the light emitting unit, wherein the encapsulation layer at least includes an inorganic insulation layer. The light-emitting structure layer 103 may have a structure with a single layer or a film layer structure with multiple layers. For example, the light-emitting structure layer 103 may include a film layer structure with three layers, that is, the light-emitting structure layer 103 may include a first inorganic insulation layer, a second inorganic insulation layer and an organic insulation layer disposed between the first inorganic insulation layer and the second inorganic insulation layer.

In an exemplary implementation, the optical structure film layer 2 may include at least one of: a second optical adhesive layer 201, a polarizer 202, a third optical adhesive layer 203 and a cover plate 204. The optical structure film layer 2 may be a structure with a single layer or a film layer structure with multiple layers. As shown in FIG. 4, the optical structure film layer 2 may include a second optical adhesive layer 201 disposed on the encapsulation layer in the light-emitting structure layer 103, a polarizer 202 disposed at a side of the second optical adhesive layer 201 away from the light-emitting structure layer 103, a third optical adhesive layer 203 disposed at a side of the polarizer 202 away from the second optical adhesive layer 201, and a cover plate 204 disposed at a side of the third optical adhesive layer 203 away from the polarizer 202.

As shown in FIG. 3 and FIG. 4, in a direction parallel to the plane where the display panel is located, the display panel according to the embodiment of the present application has at least one bendable region 10, wherein the display panel can be bent at the at least one bendable region 10. AA' is a bending axis of a bendable region 10. In a direction along the bending axis AA' of the bendable region 10, at least part of an edge of the optical structure film layer 2 is provided with a protrusion 3, and a vertical projection of the protrusion 3 on the optical structure film layer 2 does not overlap with a vertical projection of the display device layer 1 on the optical structure film layer 2, and at least part of the protrusion 3 is located in the bendable region 10.

In an exemplary implementation, the bendable region 10 may be located at a middle or a side edge of the display panel, such that the display panel may be bent at the bendable region 10. It should be noted that a position of the bendable region 10 on the display panel may be defined according to actual usage, so long as the display panel can be bent at the bendable region 10, and the position of the bendable region 10 is not limited herein.

The display panel according to the embodiment of the present application can disperse stress concentration at an edge position of the bendable region 10 through the protrusion 3. The stress at the edge position of the bendable region 10 is effectively reduced, thereby preventing the film layer from being damaged due to an excessive stress, avoiding poor display of the display device layer 1, thus improving elastic recovery ability of the bendable region 10, and improving the bending durability of the display panel.

Taking a distance of 0.1 mm from an edge of the protrusion 3 to an edge of the display device layer 1 in the display panel according to the embodiment of the present application as an example, a bending simulation experiment is carried out for the display panel according to an embodiment of the present application and the display panel of related art. According to the strain detection of an edge position of the encapsulation layer at an arc midline of the bendable region, strain at the edge position of the encapsulation layer at the arc midline of the bendable region of the panel according to the embodiment of the present application is 5.5‰, and strain at the edge position of the encapsulation layer at the arc midline of the bendable region of the panel in the related art is 6.4‰, thus indicating that the protrusion 3 can effectively reduce stress concentration effect at the edge.

In an exemplary implementation, in the direction along the bending axis AA' of the bendable region 10, at least part of one side edge of the optical structure film layer 2 is provided with a protrusion 3; alternatively, at least part of each of two side edges of the optical structure film layer 2 is provided with a protrusion 3, wherein the protrusion 3 can effectively reduce stress at edge position on one side edge or the two side edges of the bendable region 10.

In the exemplary implementation, as shown in FIG. 4, in the direction along the bending axis AA' of the bendable region 10, a distance L from an edge of the protrusion 3 to an edge of the display device layer 1 is 0.05 mm to 0.5 mm, such that the protrusion 3 does not occupy too much area of the display panel, so as to avoid affecting the display effect of the display panel, and the bending durability of the display panel is also improved at the same time.

In an exemplary implementation, as shown in FIG. 4, the optical structure film layer 2 may include a second optical adhesive layer 201 disposed on the encapsulation layer in the light-emitting structure layer 103, a polarizer 202 disposed at a side of the second optical adhesive layer 201 away from the light-emitting structure layer 103, a third optical adhesive layer 203 disposed at a side of the polarizer 202 away from the second optical adhesive layer 201, and a cover plate 204 disposed at a side of the third optical adhesive layer 203 away from the polarizer 202. A protrusion 3 is provided at an edge of at least one of the second optical adhesive layer 201, the polarizer 202, the third optical adhesive layer 203, and the cover plate 204 in the direction along the bending axis AA' of the bendable region 10. For example, the second optical adhesive layer 201, the polarizer 202, the third optical adhesive layer 203 and the cover plate 204 are each provided with a protrusion 3 at an edge thereof.

In an exemplary implementation, as shown in FIG. 3, in the bendable region 10, the entire edge of the optical structure film layer 2 is provided with the protrusion 3, such that the protrusion 3 can effectively reduce the stress at the entire edge of the bendable region 10.

In some embodiments, in the bendable region 10, a part of the edge of the optical structure film layer 2 is provided with a protrusion, such that the protrusion can effectively reduce the stress at a particular edge position of the bendable region.

In an exemplary implementation, as shown in FIG. 3 and FIG. 4, the display panel according to the embodiment of the present application further has a non-bendable region 20 connected to the bendable region 10 on a plane parallel to the display panel, and the non-bendable region 20 is an region of the display panel other than the bendable region 10. At least part of the protrusion 3 may be located in the non-bendable region 20. For example, in the non-bendable region 20, in the direction along the bending axis AA' of the bendable region 10, the entire edge of the optical structure film layer 2 is provided with the protrusion 3, such that the protrusion 3 can effectively reduce the stress at the entire edge of the non-bendable region 20.

In some embodiments, in the non-bendable region 20, a part of the edge of the optical structure film layer 2 is provided with the protrusion 3, such that the protrusion 3 can effectively reduce the stress at a particular edge position of the non-bendable region 20.

In an exemplary implementation, as shown in FIG. 3 and FIG. 4, the protrusion 3 located in the bendable region 10 and the protrusion 3 located in the non-bendable region 20 are formed into an integrated structure, thereby simplifying the process and facilitating the preparation.

In some embodiments, the protrusion 3 located in the bendable region 10 and the protrusion 3 located in the non-bendable region 20 are disconnected from each other, avoiding mutual transmission of stress between the protrusion 3 located in the bendable region 10 and the protrusion 3 located in the non-bendable region 20, effectively reducing the stress at an edge position of the display panel.

Figure 17:
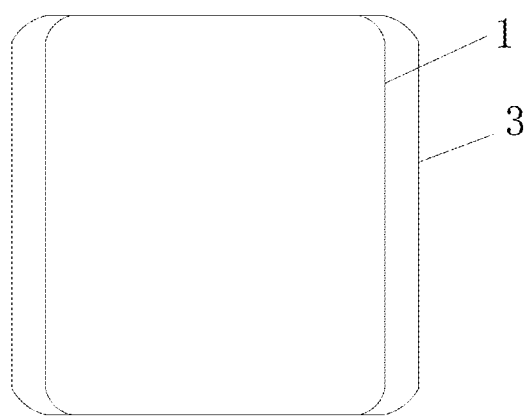
FIG. 17 is a first schematic diagram of a structure of a protrusion in a display panel according to an embodiment of the present application.
Figure 18:
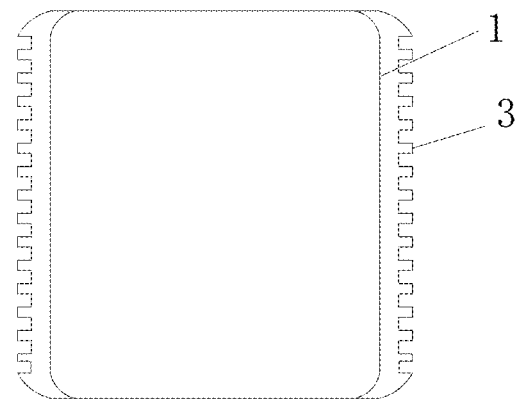
FIG. 18 is a second schematic diagram of a structure of a protrusion in a display panel according to an embodiment of the present application.
Figure 19:
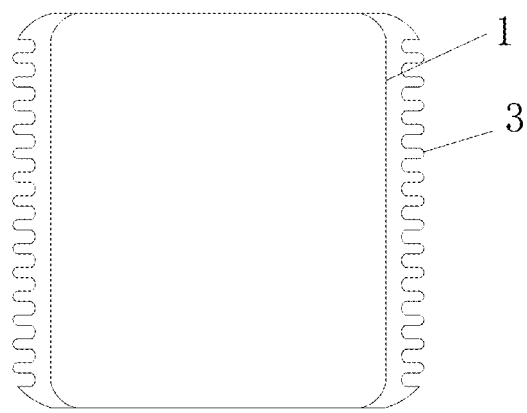
FIG. 19 is a third schematic diagram of a structure of a protrusion in a display panel according to an embodiment of the present application.
Figure 20:
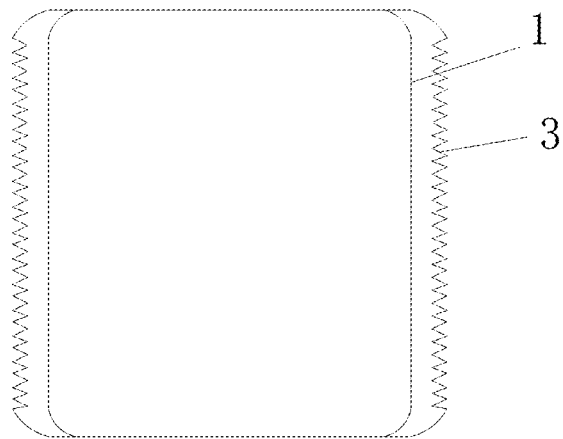
FIG. 20 is a fourth schematic diagram of a structure of a protrusion in a display panel according to an embodiment of the present application.
Figure 21:
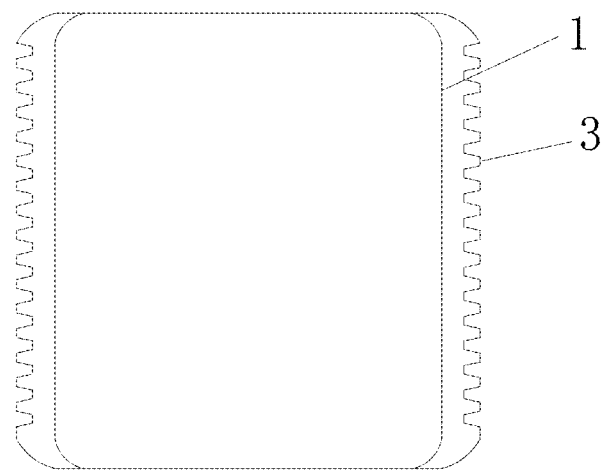
FIG. 21 is a fifth schematic diagram of a structure of a protrusion in a display panel according to an embodiment of the present application.

FIG. 17 is a first schematic diagram of a structure of a protrusion in a display panel according to an embodiment of the present application. FIG. 18 is a second schematic diagram of a structure of a protrusion in a display panel according to an embodiment of the present application. FIG. 19 is a third schematic diagram of a structure of a protrusion in a display panel according to an embodiment of the present application. FIG. 20 is a fourth schematic diagram of a structure of a protrusion in a display panel according to an embodiment of the present application. FIG. 21 is a fifth schematic diagram of a structure of a protrusion in a display panel according to an embodiment of the present application. In an exemplary implementation, a variety of shapes may be used for an edge of the protrusion. For example, in a plane parallel to a plane where the display panel is located, a shape of the edge of the protrusion 3 includes at least one of the followings: a straight line, a U-shaped wave, a circular arc-shaped wave, a V-shaped wave, and a trapezoidal wave. For example, in a plane parallel to the plane where the display panel is located, the shape of the edge of the protrusion 3 may be a straight line, as shown in FIG. 17; alternatively, in a plane parallel to the plane where the display panel is located, the shape of the edge of the protrusion 3 may be a U-shaped wave, as shown in FIG. 18; alternatively, in a plane parallel to the plane where the display panel is located, the shape of the edge of the protrusion 3 may be a circular arc-shaped wave, as shown in FIG. 19; alternatively, in a plane parallel to the plane where the display panel is located, the shape of the edge of the protrusion 3 may be a V-shaped wave, as shown in FIG. 20; alternatively, in a plane parallel to the plane where the display panel is located, the shape of the edge of the protrusion 3 may be a trapezoidal wave, as shown in FIG. 21.

In some embodiments, the protrusion 3 may include a plurality of sub-protrusions disconnected from each other, and a cross-sectional shape of the sub-protrusions in a plane parallel to the plane where the display panel is located may have various shapes, for example, the cross-sectional shape of the sub-protrusions in the plane parallel to the plane where the display panel is located may include at least one of a rectangle, a U-shape, a circular arc shape, a V-shape, and a trapezoid shape.

In an exemplary implementation, as shown in FIG. 3 and FIG. 4, the display panel according to the embodiment of the present application has two non-bendable regions 20 and a bendable region 10 connecting the two non-bendable regions 20. The two non-bendable regions 20 are axially symmetrical about the bending axis AA' of the bendable regions 10. In a direction perpendicular to the plane where the display panel is located, the display panel according to the embodiment of the present application includes a display device layer 1 and an optical structure film layer 2 disposed on the display device layer 1. The display device layer 1 includes a back film 101, a first optical adhesive layer 102 disposed on the back film 101, and a light-emitting structure layer 103 disposed at a side of the first optical adhesive layer 102 away from the back film 101. The optical structure film layer 2 may include a second optical adhesive layer 201 disposed on the encapsulation layer in the light-emitting structure layer 103, a polarizer 202 disposed at a side of the second optical adhesive layer 201 away from the light-emitting structure layer 103, a third optical adhesive layer 203 disposed at a side of the polarizer 202 away from the second optical adhesive layer 201, and a cover plate 204 disposed at a side of the third optical adhesive layer 203 away from the polarizer 202. In the direction along the bending axis AA' of the bendable region 10, each film structure in the optical structure film layer 2 is provided with a protrusion 3 at an edge thereof, that is, the entire edges of the second optical adhesive layer 201, the polarizer 202, the third optical adhesive layer 203 and the cover plate 204 in the optical structure film layer 2 are all provided with the protrusion 3. The protrusion 3 is located in the entire bendable region 10 and the entire non-bendable regions 20, and the protrusion 3 located in the bendable region 10 and the protrusion 3 located in the non-bendable regions 20 are formed into an integrated structure. The display panel according to the embodiment of the present application disperses the stress concentration at edge positions of the bendable region 10 and the non-bendable region 20 by the protrusion 3, so as to effectively reduce the stress at the edge positions of the display panel, thereby preventing damages to film layers caused by an excessive stress, and improving the bending durability of the display panel.

Figure 5:
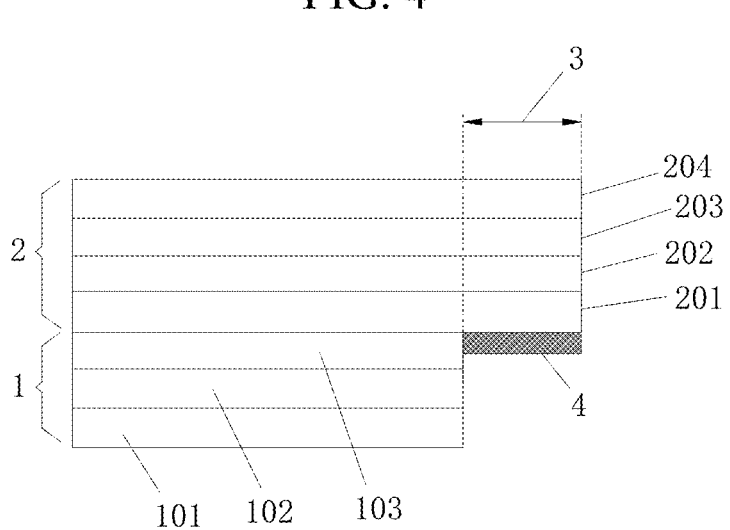
FIG. 5 is a second cross-sectional view of a display panel according to an embodiment of the present application.

FIG. 5 is a second cross-sectional view of a display panel according to an embodiment of the present application. Illustration is made with an example that FIG. 5 is a cross-sectional view taken along the B-B' direction in FIG. 3. In an exemplary implementation, as shown in FIG. 3 and FIG. 5, the display panel according to the embodiment of the present application has two non-bendable regions 20 and a bendable region 10 connecting the two non-bendable regions 20. The two non-bendable regions 20 are axially symmetrical about a bending axis AA' of the bendable region 10. In a direction perpendicular to a plane where the display panel is located, the display panel according to the embodiment of the present application includes a display device layer 1 and an optical structure film layer 2 disposed on the display device layer 1. The display device layer 1 includes a back film 101, a first optical adhesive layer 102 disposed on the back film 101, and a light-emitting structure layer 103 disposed at a side of the first optical adhesive layer 102 away from the back film 101. The optical structure film layer 2 includes a second optical adhesive layer 201 disposed on an encapsulation layer in the light-emitting structure layer 103, a polarizer 202 disposed at a side of the second optical adhesive layer 201 away from the light-emitting structure layer 103, a third optical adhesive layer 203 disposed at a side of the polarizer 202 away from the second optical adhesive layer 201, and a cover plate 204 disposed at a side of the third optical adhesive layer 203 away from the third optical adhesive layer 203. In a direction along the bending axis AA' of the bendable region 10, each film structure in the optical structure film layer 2 is provided with a protrusion 3, that is, the entire edges of the second optical adhesive layer 201, the polarizer 202, the third optical adhesive layer 203 and the cover plate 204 in the optical structure film layer 2 are all provided with the protrusion 3. The protrusion 3 is located in the entire bendable region 10 and the entire non-bendable regions 20, and the protrusion 3 located in the bendable region 10 and the protrusion 3 located in the non-bendable regions 20 are formed into an integrated structure. A surface of the protrusion 3 close to the display device layer 1 is provided with a shielding layer 4. The shielding layer 4 is configured to shield an exposed surface of the protrusion 3. For example, a surface of the second optical adhesive layer 201 in the protrusion 3 is exposed, and the shielding layer 4 is disposed on the surface of the second optical adhesive layer 201 in the protrusion 3 for shielding the exposed part of the second optical adhesive layer 201 in the protrusion 3. The shielding layer 4 is made of a non-adhesive material.

Figure 6:
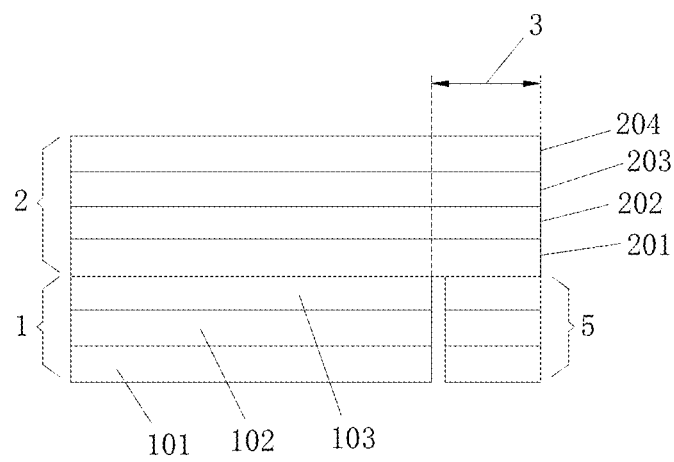
FIG. 6 is a third cross-sectional view of a display panel according to an embodiment of the present application.

FIG. 6 is a third cross-sectional view of a display panel according to an embodiment of the present application. Illustration is made with an example that FIG. 6 is a cross-sectional view taken along the B-B' direction in FIG. 3. In an exemplary implementation, as shown in FIG. 3 and FIG. 6, the display panel according to the embodiment of the present application has two non-bendable regions 20 and a bendable region 10 connecting the two non-bendable regions 20. The two non-bendable regions 20 are axially symmetrical about a bending axis AA' of the bendable region 10. In a direction perpendicular to a plane where the display panel is located, the display panel according to the embodiment of the present application includes a display device layer 1 and an optical structure film layer 2 disposed on the display device layer 1. The display device layer 1 includes a back film 101, a first optical adhesive layer 102 disposed on the back film 101, and a light-emitting structure layer 103 disposed at a side of the first optical adhesive layer 102 away from the back film 101. The optical structure film layer 2 may include a second optical adhesive layer 201 disposed on an encapsulation layer in the light-emitting structure layer 103, a polarizer 202 disposed at a side of the second optical adhesive layer 201 away from the light-emitting structure layer 103, a third optical adhesive layer 203 disposed at a side of the polarizer 202 away from the second optical adhesive layer 201, and a cover plate 204 disposed at a side of the third optical adhesive layer 203 away from the third optical adhesive layer 203. In a direction along the bending axis AA' of the bendable region 10, each film structure in the optical structure film layer 2 is provided with a protrusion 3 at an edge thereof, that is, the entire edges of the second optical adhesive layer 201, the polarizer 202, the third optical adhesive layer 203 and the cover plate 204 in the optical structure film layer 2 are all provided with the protrusion 3. The protrusion 3 is located in the entire bendable region 10 and the entire non-bendable regions 20, and the protrusion 3 located in the bendable region 10 and the protrusion 3 located in the non-bendable regions 20 are formed into an integrated structure. The display panel according to the embodiment of the present application further includes an edge device layer 5, wherein the edge device layer 5 is disposed in a same layer as the display device layer 1 and is prepared by a same preparation process using a same material. Specifically, the edge device layer 5 includes the back film 101, the first optical adhesive layer 102 disposed on the back film 101, and a light emitting structure material layer disposed at the side of the first optical adhesive layer 102 away from the back film 101. A back film material layer is disposed in a same layer as the back film 101 in the display device layer 1 and is prepared by a same preparation process using a same material. The first optical adhesive material layer is disposed in a same layer as the first optical adhesive layer 102 in the display device layer 1 and is prepared by a same preparation process using a same material. The light emitting structure material layer is disposed in a same layer as the light-emitting structure layer 103 in the display device layer 1 and is prepared by a same preparation process using a same material. A vertical projection of the edge device layer 5 on the optical structure film layer 2 is overlapped with the protrusion 3. An edge of the edge device layer 5 away from the display device layer 1 is flush with an edge of the optical structure film layer 2, and an edge of the edge device layer 5 close to the display device layer 1 is disconnected from an edge of the display device layer 1, so as to prevent stress generated by bending of the protrusion 3 from being transmitted to the display device layer 1 through the edge device layer 5.

Figure 7:
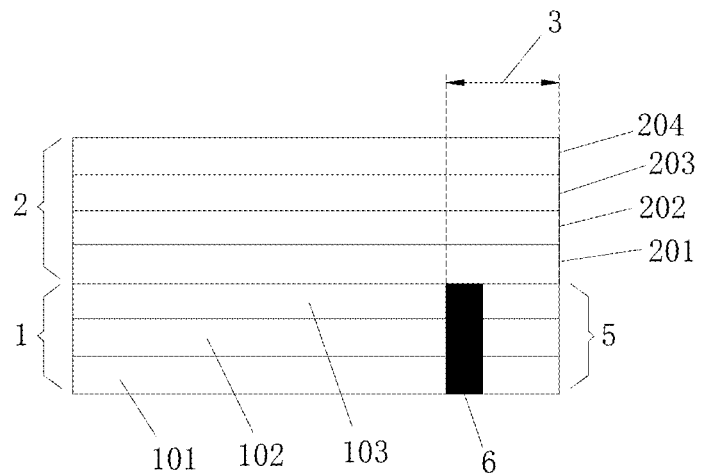
FIG. 7 is a fourth cross-sectional view of a display panel according to an embodiment of the present application.

FIG. 7 is a fourth cross-sectional view of a display panel according to an embodiment of the present application. Illustration is made with an example that FIG. 7 is a cross-sectional view taken along the B-B' direction in FIG. 3. In an exemplary implementation, as shown in FIG. 3 and FIG. 7, the display panel according to the embodiment of the present application has two non-bendable regions 20 and a bendable region 10 connecting the two non-bendable regions 20. The two non-bendable regions 20 are axially symmetrical about a bending axis AA' of the bendable region 10. In a direction perpendicular to a plane where the display panel is located, the display panel according to the embodiment of the present application includes a display device layer 1 and an optical structure film layer 2 disposed on the display device layer 1. The display device layer 1 includes a back film 101, a first optical adhesive layer 102 disposed on the back film 101, and a light-emitting structure layer 103 disposed at a side of the first optical adhesive layer 102 away from the back film 101. The optical structure film layer 2 may include a second optical adhesive layer 201 disposed on an encapsulation layer in the light-emitting structure layer 103, a polarizer 202 disposed at a side of the second optical adhesive layer 201 away from the light-emitting structure layer 103, a third optical adhesive layer 203 disposed at a side of the polarizer 202 away from the second optical adhesive layer 201, and a cover plate 204 disposed at a side of the third optical adhesive layer 203 away from the third optical adhesive layer 203. In the direction along the bending axis AA' of the bendable region 10, each film structure in the optical structure film layer 2 is provided with a protrusion 3 at an edge thereof, that is, the entire edges of the second optical adhesive layer 201, the polarizer 202, the third optical adhesive layer 203 and the cover plate 204 in the optical structure film layer 2 are all provided with the protrusion 3. The protrusion 3 is located in the entire bendable region 10 and the entire non-bendable regions 20, and the protrusion 3 located in the bendable region 10 and the protrusion 3 located in the non-bendable regions 20 are formed into an integrated structure. The display panel according to the embodiment of the present application further includes an edge device layer 5, wherein the edge device layer 5 is disposed in a same layer as the display device layer 1 and is prepared by a same preparation process using a same material. Specifically, the edge device layer 5 includes the back film 101, the first optical adhesive layer 102 disposed on the back film 101, and a light emitting structure material layer disposed at a side of the first optical adhesive layer 102 away from the back film 101. A back film material layer is disposed in a same layer as the back film 101 in the display device layer 1 and is prepared by a same preparation process using a same material. The first optical adhesive material layer is disposed in a same layer as the first optical adhesive layer 102 in the display device layer 1 and is prepared by a same preparation process using a same material. The light emitting structure material layer is disposed in a same layer as the light-emitting structure layer 103 in the display device layer 1 and is prepared by a same preparation process using a same material. A vertical projection of the edge device layer 5 on the optical structure film layer 2 is overlapped with the protrusion 3. An edge of the edge device layer 5 away from the display device layer 1 is flush with an edge of the optical structure film layer 2, an insulation adhesive layer 6 is disposed between an edge of the edge device layer 5 close to the display device layer 1 and an edge of the display device layer 1. The insulation adhesive layer 6 can prevent stress generated by bending of the protrusion 3 from being transmitted to the display device layer 1 through the edge device layer 5, and can bond the edge device layer 5 to the display device layer 1 at the same time, so as to prevent the edge device layer 5 from falling off.

Figure 8:
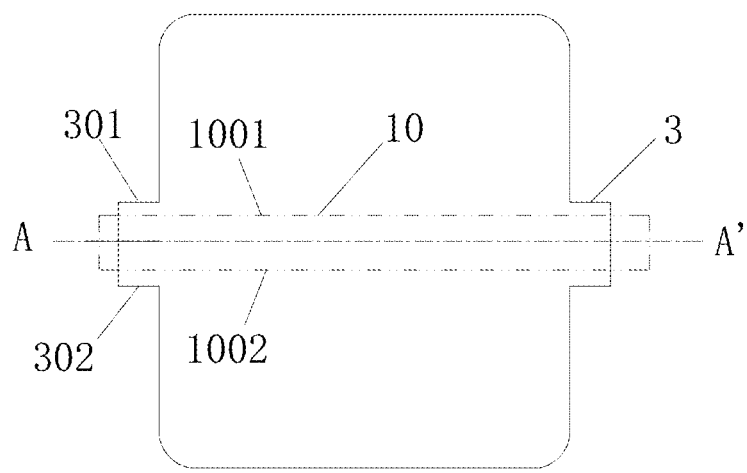
FIG. 8 is a second schematic diagram of a structure of a display panel according to an embodiment of the present application.

FIG. 8 is a second schematic diagram of a structure of a display panel according to an embodiment of the present application. In an exemplary implementation, as shown in FIG. 8, the display panel according to the embodiment of the present application has two non-bendable regions 20 and a bendable region 10 connecting the two non-bendable regions 20. The two non-bendable regions 20 are axially symmetrical about a bending axis AA' of the bendable region 10. The protrusion 3 is located in the entire bendable region 10 and a part of a non-bendable region 20, and the protrusion located in the bendable region 10 and the protrusion located in the non-bendable region 20 are formed into an integrated structure. The protrusion 3 can disperse stress concentration at an edge position the bendable region 10, so as to effectively reduce the stress at the edge position of the display panel, thereby preventing damages to film layers caused by an excessive stress, and improving the bending durability of the display panel.

In an exemplary implementation, as shown in FIG. 8, in a direction perpendicular to the bending axis AA' of the bendable region 10, the protrusion 3 has a first edge 301 and a second edge 302 oppositely arranged, and the bendable region 10 has a third edge 1001 and a fourth edge 1002 oppositely arranged, wherein the first edge 301 and the third edge 1001 are located at a first side of the bending axis AA' of the bendable region 10, and the second edge 302 and the fourth edge 1002 are located at a second side of the bending axis AA' of the bendable region 10. The first side and the second side are located at opposite sides of the bending axis AA' of the bendable region 10. In a direction perpendicular to the bending axis AA' of the bendable region 10, the first edge 301 extends beyond the third edge 1001 and a distance from the first edge 301 to the third edge 1001 is greater than or equal to a bending tolerance, and/or, the second edge 302 extends beyond the fourth edge 1002, wherein a distance from the second edge 302 to the fourth edge 1002 is greater than or equal to abending tolerance, so as to avoid a situation that the protrusion 3 is inwardly contracted when the bendable region 10 is bent, leading to that no protrusion 3 is disposed at the edge of the bendable region 10. The bending tolerance refers to a distance by which the first edge 301 or the second edge 302 of the protrusion 3 is moved by the inward contraction of the optical structure film layer 2 when the bendable region 10 is bent along a direction towards the optical structure film layer 2. For example, the bending tolerance is 200 μm, the distance from the first edge to the third edge is greater than or equal to 200 μm, and the distance from the second edge to the fourth edge is greater than or equal to 200 μm.

Figure 9:
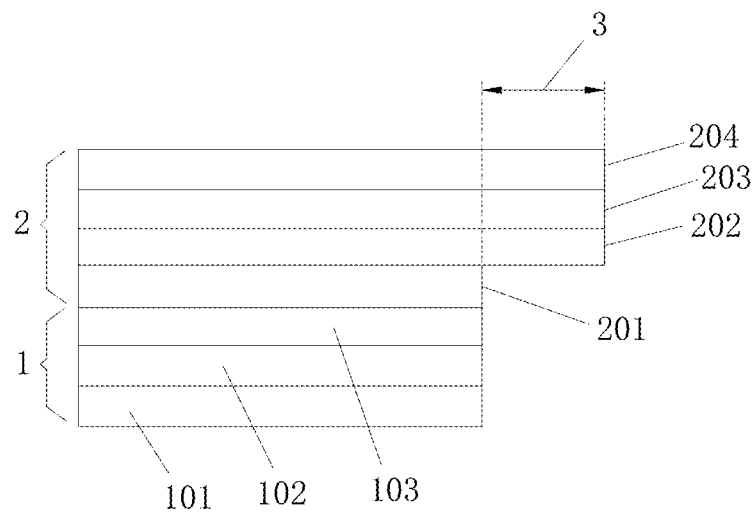
FIG. 9 is a fifth cross-sectional view of a display panel according to an embodiment of the present application.

FIG. 9 is a fifth cross-sectional view of a display panel according to an embodiment of the present application. Illustration is made with an example that FIG. 9 is a cross-sectional view taken along B-B' direction in FIG. 3. In an exemplary implementation, as shown in FIG. 3 and FIG. 9, the display panel according to the embodiment of the present application has two non-bendable regions 20 and a bendable region 10 connecting the two non-bendable regions 20. The two non-bendable regions 20 are axially symmetrical about a bending axis AA' of the bendable region 10. In a direction perpendicular to a plane where the display panel is located, the display panel according to the embodiment of the present application includes a display device layer 1 and an optical structure film layer 2 disposed on the display device layer 1. The display device layer 1 includes a back film 101, a first optical adhesive layer 102 disposed on the back film 101, and a light-emitting structure layer 103 disposed at a side of the first optical adhesive layer 102 away from the back film 101. The optical structure film layer 2 may include a second optical adhesive layer 201 disposed on an encapsulation layer in the light-emitting structure layer 103, a polarizer 202 disposed at a side of the second optical adhesive layer 201 away from the light-emitting structure layer 103, a third optical adhesive layer 203 disposed at a side of the polarizer 202 away from the second optical adhesive layer 201, and a cover plate 204 disposed at a side of the third optical adhesive layer 203 away from the third optical adhesive layer 203. In a direction along the bending axis AA' of the bendable region 10, a part of film layer structures in the optical structure film layer 2 are provided with a protrusion 3, for example, the edges of the polarizer 202, the third optical adhesive layer 203 and the cover plate 204 in the optical structure film layer 2 are all provided with the protrusion 3, and an edge of the second optical adhesive layer 201 in the optical structure film layer 2 are flush with an edges of the display device layer 1. The protrusion 3 is located in the bendable region 10 and the non-bendable regions 20, and the protrusion 3 located in the bendable region 10 and the protrusion 3 located in the non-bendable regions 20 are formed into an integrated structure.

Figure 10:
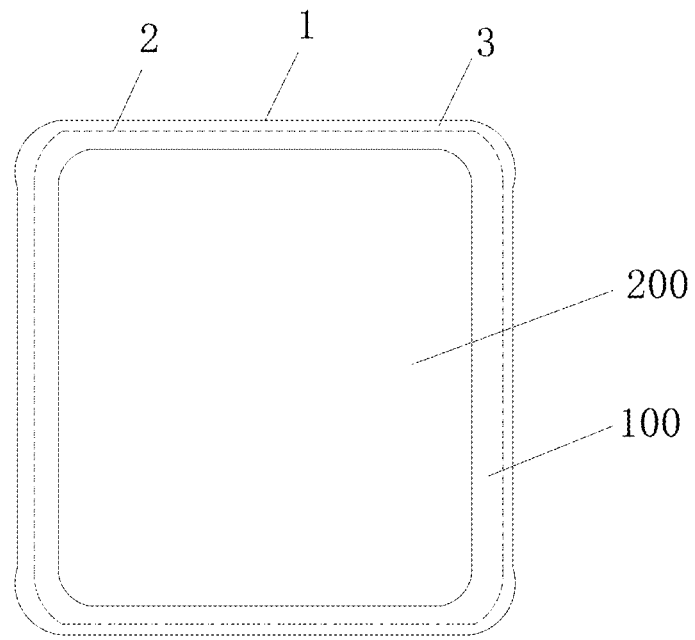
FIG. 10 is a third schematic diagram of a structure of a display panel according to an embodiment of the present application.

FIG. 10 is a third schematic diagram of a structure of a display panel according to an embodiment of the present application. As shown in FIG. 10, in a direction parallel to a plane where the display panel is located, the display panel according to the embodiment of the present application has a planarization region 200 and a curved edge 100 located at a circumferential side of the planarization region 200, wherein the curved edge 100 in the display panel can be bent. The curved edge 100 includes a display device layer 1 and an optical structure film layer 2 disposed on the display device layer 1. An edge of at least part of the optical structure film layer 2 is provided with a protrusion 3, and a vertical projection of the protrusion 3 on the optical structure film layer 2 does not overlap with a vertical projection of the display device layer 1 on the optical structure film layer 2. The curved edge 100 may include a bendable edge part and a bendable corner part.

The display panel according to the embodiment of the present application can disperse stress concentration at the curved edge 100 by the protrusion 3, the stress at the curved edge 100 is effectively reduced, thereby preventing film layers from being damaged due to an excessive stress, avoiding poor display in the planarization region, thus improving elastic recovery ability of the curved edge 100 and improving the bending durability of the display panel.

An embodiment of the present application further provides a display apparatus, including any one of the display panel described above. The display apparatus includes a mobile phone, a tablet computer, a smart wearable product (such as a smart watch, a bracelet, or the like), a personal digital assistant (PDA), a vehicle-mounted computer, or the like. A specific form of the above display device is not specially limited in the embodiments of the present application.

An embodiment of the present application further provides a method for preparing a display panel, including:
    forming a display device layer and forming at least a part of film layers in an optical structure film layer;
    attaching the at least a part of the film layers in the optical structure film layer to the display device layer, so as to extend an edge of the at least part of the film layers in the optical structure film layer beyond an edge of the display device layer;
    forming another part of the film layers in the optical structure film layer on the at least part of the film layers in the optical structure film layer to form the optical structure film layer, wherein the display device layer and the optical structure film layer constitute a display panel, and the display panel has at least one bendable region, and in a direction along the bending axis AA' of the at least one bendable region, the edge of the at least part of the film layers in the optical structure film layer extends beyond the edge of the display device layer to form protrusion, and at least part of the protrusion is located in the bendable region.

The method for preparing the display panel according to the embodiment of the present application further includes:
forming a shielding layer on a surface of the protrusion close to the display device layer.

Figure 11:
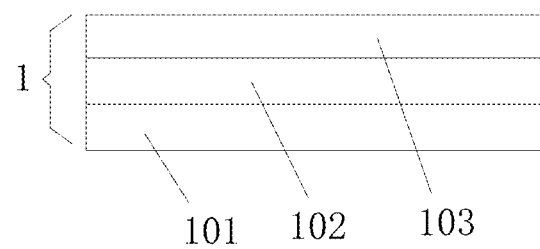
FIG. 11 is a schematic diagram after a display device layer is formed in a method for preparing a display panel according to an embodiment of the present application.

FIG. 11 to FIG. 15 are schematic diagrams showing a preparation process of a display panel according to an embodiment of the present application. In an exemplary implementation, a method for preparing the display panel includes:

1) Forming a display device layer. Formation of the display device layer includes: attaching a panel of a back film material to a panel of a light-emitting structure material through a first optical adhesive layer 102, cutting the panel of the back film material, the first optical adhesive layer 102 and the panel of the light-emitting structure material integrally, so as to form the panel of the back film material into form a back film 101 and form the panel of the light-emitting structure material into an light-emitting structure layer 103, as shown in FIG. 11. The back film 101, the first optical adhesive layer 102, and the light-emitting structure layer 103 are combined to form the display device layer 1. The light-emitting structure layer 103 at least includes a light emitting unit and an encapsulation layer disposed on the light emitting unit, and the encapsulation layer at least includes an inorganic insulation layer.

Figure 12:
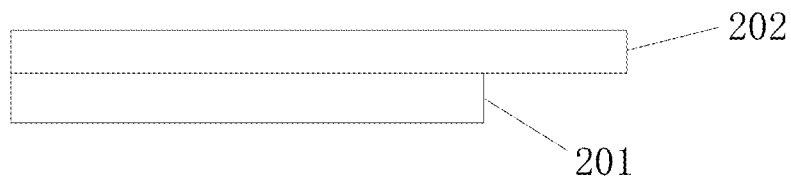
FIG. 12 is a schematic diagram after a polarizer is formed in a method for preparing a display panel according to an embodiment of the present application.

2) Forming a polarizer. Formation of the polarizer includes: cutting a panel of a polarizing material so as to form the panel of the polarizing material into a polarizer 202, forming a second optical adhesive layer 201 on the polarizer 202 so as to extend an edge of the polarizer 202 beyond an edge of the second optical adhesive layer 201, as shown in FIG. 12. The polarizer 202 and the second optical adhesive layer 201 are part of the film layers of the optical structure film layer.

Figure 13:
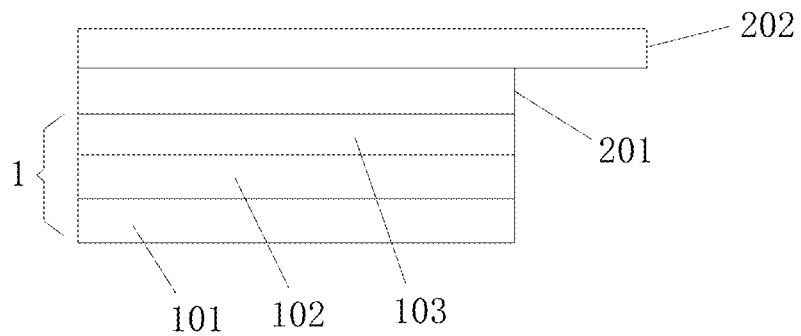
FIG. 13 is a first schematic diagram after a polarizer is attached to a display device layer in a method for preparing a display panel according to an embodiment of the present application.

3) Attaching the polarizer to the display device layer. Attachment of the polarizer to the display device layer includes: attaching the polarizer 202 to the light-emitting structure layer 103 in the display device layer 1 through the second optical adhesive layer 201, as shown in FIG. 13. The edge of the second optical adhesive layer 201 is flush with the edge of the display device layer 1, and the edge of the polarizer 202 extends beyond the edge of the display device layer 1.

4) Forming an optical structure film layer and a protrusion. Formation of the optical structure film layer and the protrusion includes: sequentially forming a third optical adhesive layer 203 and a cover plate 204 on the polarizer 202, wherein edges of the third optical adhesive layer 203 and the cover plate 204 are flush with the edge of the polarizer 202. The second optical adhesive layer 201, the polarizer 202, the third optical adhesive layer 203 and the cover plate 204 form the optical structure film layer 2; the display device layer 1 and the optical structure film layer 2 constitute a display panel, and the display panel has at least one bendable region 10; in a direction along a bending axis AA' of the at least one bendable region 10, the edges of the polarizer 202, the third optical adhesive layer 203, and the cover plate 204 extend beyond the edge of the display device layer 1 to form the protrusion 3, and at least a part of the protrusion 3 is located in the bendable region 10, as shown in FIG. 9.

In some embodiments, the edges of the third optical adhesive layer 203 and the cover plate 204 may be not flush with the edge of the polarizer 202. For example, the edges of the third optical adhesive layer 203 and the cover plate 204 are inwardly contracted or outwardly expanded with respect to the edge of the polarizer 202.

In an exemplary implementation, the method for preparing the display panel includes:

1) Forming a display device layer. Formation of the display device layer includes: attaching a panel of a back film material to a panel of a light-emitting structure material through a first optical adhesive layer 102, cutting the panel of the back film material, the first optical adhesive layer 102 and the light-emitting structure material panel integrally, so as to form the panel of the back film material into a back film 101 and form the panel of the light-emitting structure material into an light-emitting structure layer 103, as shown in FIG. 11. The back film 101, the first optical adhesive layer 102, and the light-emitting structure layer 103 are combined to form the display device layer 1. The light-emitting structure layer 103 at least includes a light emitting unit and an encapsulation layer disposed on the light emitting unit, and the encapsulation layer at least includes an inorganic insulation layer.

Figure 14:
FIG. 14 is a second schematic diagram after a polarizer is formed in a method for preparing a display panel according to an embodiment of the present application.

2) Forming a polarizer. Formation of the polarizer includes: cutting a panel of a polarizing material so as to form the panel of the polarizing material into a polarizer 202, forming a second optical adhesive layer 201 on the polarizer 202 so as to make an edge of the polarizer 202 flush with an edge of the second optical adhesive layer 201, as shown in FIG. 14.

Figure 15:
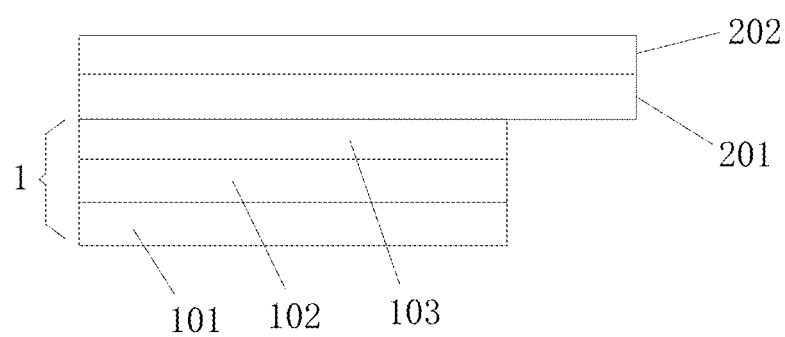
FIG. 15 is a second schematic diagram after a polarizer is attached to a display device layer in a method for preparing a display panel according to an embodiment of the present application.

3) Attaching the polarizer to the display device layer. Attachment of the polarizer to the display device layer includes: attaching the polarizer 202 to the light-emitting structure layer 103 in the display device layer 1 through the second optical adhesive layer 201, as shown in FIG. 15. Edges of both the polarizer 202 and the second optical adhesive layer 201 extend beyond an edge of the display device layer 1.

4) Forming an optical structure film layer and a protrusion. Formation of the optical structure film layer and the protrusion includes: sequentially forming a third optical adhesive layer 203 and a cover plate 204 on the polarizer 202, wherein edges of the third optical adhesive layer 203 and the cover plate 204 are flush with the edge of the polarizer 202. The second optical adhesive layer 201, the polarizer 202, the third optical adhesive layer 203 and the cover plate 204 constitute the optical structure film layer 2; the display device layer 1 and the optical structure film layer 2 constitute a display panel, and the display panel has at least one bendable region 10; in a direction along the bending axis AA' of the at least one bendable region 10, edges of the second optical adhesive layer 201, the polarizer 202, the third optical adhesive layer 203, and the cover plate 204 extend beyond the edge of the display device layer 1 to form the protrusion 3, and at least a part of the protrusion 3 is located in the bendable region 10. A shielding layer 4 is formed on a surface of the protrusion at a side close to the display device layer, as shown in FIG. 5.

In some embodiments, the edges of the third optical adhesive layer 203 and the cover plate 204 may be not flush with the edge of the polarizer 202. For example, the edges of the third optical adhesive layer 203 and the cover plate 204 are inwardly contracted or outwardly expanded with respect to the edge of the polarizer 202.

5) Forming a shielding layer 4 on a surface of the protrusion 3 at a side close to the display device layer 1, as shown in FIG. 5.

In an exemplary implementation, the method for preparing the display panel includes:

1) Forming a display device panel and forming at least a part of film layers in an optical structure film layer. Formation of the display device panel and formation of at least a part of film layers in an optical structure film layer include: attaching a panel of a back film material to a panel of a light emitting structure material through a first optical adhesive layer 102 to form a display device panel; attaching a polarizer 202 to the panel of the light emitting structure material in the display device panel through a second optical adhesive layer 201; cutting the display device panel to remove a peripheral region of the display device panel.

2) Forming an edge device layer. Formation of the edge device layer includes: cutting an edge region of the display device panel without cutting the polarizer 202 and the second optical adhesive layer 201 through a laser half-cutting process, so as to form a main part of the display device panel into a display device layer 1 and form the edge region of the display device panel into an edge device layer 5; a cutting gap is formed between an edge of the edge device layer 5 and an edge of the display device layer 1. A main part of the panel of the back film material in the display device panel is formed into a back film 101, and a main part of the panel of the light emitting structure material in the display device panel is formed into a light-emitting structure layer 103; the back film 101, the first optical adhesive layer 102, and the light-emitting structure layer 103 constitute the display device layer 1. The light-emitting structure layer 103 at least includes a light emitting unit and an encapsulation layer disposed on the light emitting unit, and the encapsulation layer at least includes an inorganic insulation layer.

Figure 16:
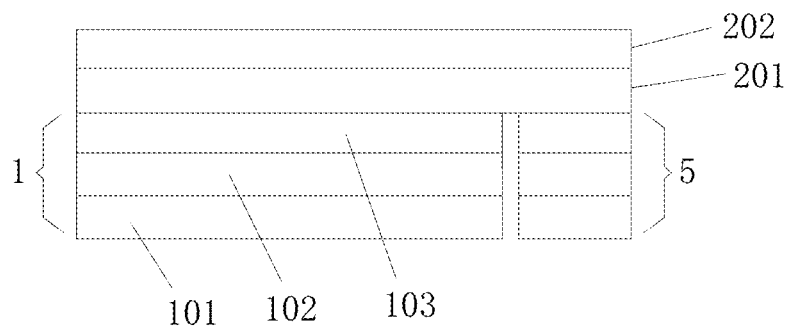
FIG. 16 is a schematic diagram after filling of an insulation adhesive layer in a method for preparing a display panel according to an embodiment of the present application.

3) Fill an insulation adhesive layer 6 in the cutting gap, as shown in FIG. 16.

4) Forming an optical structure film layer and a protrusion. Formation of the optical structure film layer and the protrusion includes: sequentially forming a third optical adhesive layer 203 and a cover plate 204 on the polarizer 202, wherein edges of the third optical adhesive layer 203 and the cover plate 204 are flush with an edge of the polarizer 202. The second optical adhesive layer 201, the polarizer 202, the third optical adhesive layer 203 and the cover plate 204 constitute the optical structure film layer 2; the display device layer 1 and the optical structure film layer 2 constitute a display panel, and the display panel has at least one bendable region 10; in a direction along a bending axis AA' of the at least one bendable region 10, edges of the second optical adhesive layer 201, the polarizer 202, the third optical adhesive layer 203, and the cover plate 204 extend beyond the edge of the display device layer 1 to form a protrusion 3, and at least a part of the protrusion 3 is located in the bendable region 10. The edge device layer 5 is disposed in a same layer as the display device layer 1, and a vertical projection of the edge device layer 5 on the optical structure film layer 2 overlaps with the protrusion 3, as shown in FIG. 7.

In some embodiments, the edges of the third optical adhesive layer 203 and the cover plate 204 may be not flush with the edge of the polarizer 202. For example, the edges of the third optical adhesive layer 203 and the cover plate 204 are inwardly contracted or outwardly expanded with respect to the edge of the polarizer 202.

In an exemplary implementation, the method for preparing the display panel includes:

1) Forming a display device panel and forming at least a part of film layers in an optical structure film layer. Formation of the display device panel and formation of at least a part of film layers in the optical structure film layer include: attaching a panel of a back film material to a panel of a light emitting structure material through a first optical adhesive layer 102 to form a display device panel; attaching a polarizer 202 to the panel of the light emitting structure material in the display device panel through a second optical adhesive layer 201; cutting the display device panel to remove a peripheral region of the display device panel.

2) Forming an edge device layer. Formation of the edge device layer includes: cutting an edge region of the display device panel without cutting the polarizer 202 and the second optical adhesive layer 201 through a laser half-cutting process, so as to form a main part of the display device panel into a display device layer 1 and form the edge region of the display device panel into an edge device layer 5; a cutting gap is formed between an edge of the edge device layer 5 and an edge of the display device layer 1. A main part of the panel of the back film material in the display device panel is formed into a back film 101, and a main part of a panel of the light emitting structure material in the display device panel is formed into a light-emitting structure layer 103; the back film 101, the first optical adhesive layer 102, and the light-emitting structure layer 103 constitute the display device layer 1. The light-emitting structure layer 103 at least includes a light emitting unit and an encapsulation layer disposed on the light emitting unit, and the encapsulation layer at least includes an inorganic insulation layer.

3) Forming an optical structure film layer and a protrusion. Formation of the optical structure film layer and the protrusion includes: removing the edge device layer 5; sequentially forming a third optical adhesive layer 203 and a cover plate 204 on the polarizer 202, wherein the edges of the third optical adhesive layer 203 and the cover plate 204 are flush with the edge of the polarizer 202. The second optical adhesive layer 201, the polarizer 202, the third optical adhesive layer 203 and the cover plate 204 constitute an optical structure film layer 2; the display device layer 1 and the optical structure film layer 2 constitute a display panel, and the display panel has at least one bendable region 10; in a direction along the bending axis AA' of the at least one bendable region 10, edges of the second optical adhesive layer 201, the polarizer 202, the third optical adhesive layer 203, and the cover plate 204 extend beyond the edge of the display device layer 1 to form the protrusion 3, and at least a part of the protrusion 3 is located in the bendable region 10. A shielding layer is formed on a surface of the protrusion at a side close to the display device layer, as shown in FIG. 5.

In some embodiments, the edges of the third optical glue layer 203 and the cover plate 204 may be not flush with the edge of the polarizer 202. For example, the edges of the third optical adhesive layer 203 and the cover plate 204 are inwardly contracted or outwardly expanded with respect to the edge of the polarizer 202.

The drawings of the present disclosure only involve structures involved in the present disclosure, and other structures may refer to conventional designs. The embodiments in the present disclosure, i.e., features in the embodiments, may be combined with each other to obtain new embodiments if there is no conflict.

Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display panel having at least one bendable region, and the display panel comprises a display device layer and an optical structure film layer disposed on the display device layer, in a direction along a bending axis of the at least one bendable region, an edge of at least a part of the optical structure film layer is provided with a protrusion, and a vertical projection of the protrusion on the optical structure film layer does not overlap with a vertical projection of the display device layer on the optical structure film layer, and at least a part of the protrusion is located in the at least one bendable region;

wherein the display panel further has a non-bendable region connected to the bendable region; in the non-bendable region, in a direction along a bending axis of the at least one bendable region, an entire edge of the optical structure film layer is provided with the protrusion; or, in the non-bendable region, in the direction along the bending axis of the at least one bendable region, a part of the edge of the optical structure film layer is provided with the protrusion.

2. The display panel according to claim 1, wherein a distance between an edge of the protrusion and an edge of the display device layer is 0.05 mm to 0.5 mm in the direction along the bending axis of the at least one bendable region.

3. The display panel according to claim 1, wherein, in a bendable region, an entire edge of the optical structure film layer is provided with the protrusion; or, in the bendable region, a part of the edge of the optical structure film layer is provided with the protrusion.

4. The display panel according to claim 1, wherein the protrusion located in the bendable region and the protrusion located in the non-bendable region are formed in to an integrated structure; or, the protrusion located in the bendable region and the protrusion located in the non-bendable region are disconnected from each other.

5. The display panel according to claim 1, wherein the protrusion is located in the entire bendable region and in a part of the non-bendable region, the protrusion in the bendable region and the protrusion in the non-bendable region are formed into an integrated structure; in a direction perpendicular to the bending axis of the bendable region, the protrusion has a first edge and a second edge oppositely arranged, the bendable region has a third edge and a fourth edge oppositely arranged, the first edge and the third edge are located at a first side of the bending axis of the bendable region, and the second edge and the fourth edge are located at a second side of the bending axis of the bendable region; wherein the first side and the second side are located at opposite sides of the bending axis of the bendable region; and the first edge extends beyond the third edge, and a distance from the first edge to the third edge is greater than or equal to a bending tolerance; and/or, the second edge extends beyond the fourth edge, and a distance from the second edge to the fourth edge is greater than or equal to the bending tolerance.

6. The display panel according to claim 1, wherein in a plane parallel to the plane where the display panel is located, a shape of an edge of the protrusion comprises at least one of the following: a straight line, a U-shaped wave, a circular arc-shaped wave, a V-shaped wave, and a trapezoidal wave.

7. The display panel according to claim 1, wherein the protrusion comprises a plurality of sub-protrusions disconnected from each other.

8. The display panel according to claim 7, wherein a cross-sectional shape of the sub-protrusion in a plane parallel to the display panel comprises at least one of the following: a rectangle, a U-shape, a circular arc, a V-shape, and a trapezoid.

9. The display panel according to claim 1, wherein a surface of the protrusion close to the display device layer is provided with a shielding layer.

10. The display panel according to claim 1, wherein the display panel further comprises an edge device layer, wherein the edge device layer is disposed in a same layer as the display device layer, a vertical projection of the edge device layer on the optical structure film layer is overlapped with the protrusion, an edge of the edge device layer close to the display device layer and an edge of the display device layer are disconnected from each other, and an edge of the edge device layer away from the display device layer is flush with an edge of the optical structure film layer.

11. The display panel according to claim 10, wherein an insulation adhesive layer is disposed between the edge of the edge device layer close to the display device layer and the edge of the display device layer.

12. The display panel according to claim 1, wherein the optical structure film layer comprises a second optical adhesive layer, a polarizer disposed on the second optical adhesive layer, a third optical adhesive layer disposed at a side of the polarizer away from the second optical adhesive layer, and a cover plate disposed at a side of the third optical adhesive layer away from the polarizer; in the direction along the bending axis of the at least one bendable region, an edge of at least one of the second optical adhesive layer, the polarizer, the third optical adhesive layer and the cover plate is provided with the protrusion.

13. A display apparatus, comprising the display panel according to claim 1.

* * * * *